United States Patent
Cox et al.

(10) Patent No.: US 6,682,113 B2
(45) Date of Patent: Jan. 27, 2004

(54) WAFER CLAMPING MECHANISM

(75) Inventors: Damon Keith Cox, Round Rock, TX (US); Venugopal Menon, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/991,288

(22) Filed: Nov. 16, 2001

(65) Prior Publication Data

US 2003/0094824 A1 May 22, 2003

(51) Int. Cl.⁷ .................................................. B66C 1/00
(52) U.S. Cl. .................... 294/104; 294/116; 414/744.5; 414/941
(58) Field of Search .............................. 294/103.1, 104, 294/116; 901/15, 31, 36, 39; 414/744.5, 935, 941

(56) References Cited

U.S. PATENT DOCUMENTS

| | | | | |
|---|---|---|---|---|
| 3,841,689 A | * | 10/1974 | Hurlbrink, III | ............ 294/87.1 |
| 5,292,393 A | | 3/1994 | Maydan et al. | ............. 156/345 |
| 5,447,409 A | | 9/1995 | Grunes et al. | ........... 414/744.6 |
| 5,469,035 A | | 11/1995 | Lowrance | ................ 318/568.1 |
| 5,540,649 A | * | 7/1996 | Bonnell et al. | ............. 600/114 |
| 5,700,046 A | * | 12/1997 | Van Doren et al. | ...... 294/119.1 |
| 5,702,228 A | * | 12/1997 | Tamai et al. | ............. 414/744.5 |
| 5,746,460 A | | 5/1998 | Marohl et al. | ................ 294/1.1 |
| 5,764,012 A | | 6/1998 | Lowrance | ................ 318/568.1 |
| 5,810,935 A | | 9/1998 | Lee et al. | .................... 118/728 |
| 5,851,041 A | * | 12/1998 | Anderson et al. | ........... 294/106 |
| 5,955,858 A | | 9/1999 | Kroeker et al. | ........ 318/568.11 |
| 6,155,773 A | | 12/2000 | Ebbing et al. | ........... 414/744.5 |
| 6,283,701 B1 | * | 9/2001 | Sundar et al. | ........... 414/744.5 |

* cited by examiner

*Primary Examiner*—Dean J. Kramer
(74) *Attorney, Agent, or Firm*—Pennie & Edmonds, LLP (57) ABSTRACT

The wafer clamping apparatus is disclosed including a cam rotatably coupled to a base plate. The cam is configured to couple with a robot arm. The clamping apparatus also includes a rotating clamp mechanism rotatably coupled to the base plate about a single fixed point. A biasing mechanism, coupled to the rotating clamp mechanism, urges the rotating clamp mechanism towards a clamped position. The rotating clamp mechanism is configured to interact with the cam to engage and disengage the rotating clamp mechanism from the clamped position. The rotating clamp mechanism preferably comprises a hub rotatably coupled to the base plate and a clamping arm and cam follower extending from the hub. The clamping arm is configured to clamp a wafer when the rotating clamp mechanism is in the clamped position, while the cam follower is configured to interact with the cam.

29 Claims, 10 Drawing Sheets

WAFER CLAMPING MECHANISM

TECHNICAL FIELD

The present invention relates to a clamping mechanism for securing a semiconductor wafer during wafer handling. More particularly, the present invention is directed to a clamping mechanism that securely clamps a semiconductor wafer near the distal end of a robot arm.

BACKGROUND OF THE INVENTION

A wafer is the base material, usually silicon, used in semiconductor chip or integrated circuit fabrication. Typically, the wafer is a thin slice of base material cut from a silicon ingot or "boule." Each 8 inch (200 mm) production wafer is approximately 1/30 inch (0.85 mm) thick and has a diameter of approximately 8 inch (200 mm). Because of the nature of the base material and the thinness of each slice, the wafer can easily be damaged through mishandling.

Wafers are typically processed into semiconductor chips by sequentially exposing each wafer to a number of individual processes, such as photo masking, etching and implantation. Modern semiconductor processing systems include cluster tools that aggregate multiple process chambers together, where one or more of the individual processes are performed in each chamber. These process chambers may include, for example, degas chambers, substrate pre-conditioning chambers, cool down chambers, transfer chambers, chemical vapor deposition chambers, physical vapor deposition chambers, etch chambers, or the like.

Typically, these process chambers surround a central chamber housing a central wafer handling robot, which manipulates the individual wafers. The cluster tool also typically includes a cassette in which multiple wafers are stacked before and after semiconductor fabrication. The wafer handling robot has access to the multiple process chambers and the cassette through load ports coupling each chamber and cassette to the central chamber. During operation the wafer handling robot repetitively transports wafers from one chamber to another, or to and from the cassette. Processing times can range from a few seconds to a few minutes, depending on the specific type of process that is required. Furthermore, the cluster tool forms a sealed environment, generally at vacuum, that is controlled to limit potential contamination of the wafers and to ensure that optimal processing conditions are maintained. Examples of cluster tools can be found in U.S. Pat. Nos. 5,292,393; 5,764,012; 5,447,409; 5,469,035; and 5,955,858, all of which are incorporated herein by reference.

The high costs associated with manufacturing semiconductor devices together with the demand for lower consumer prices has brought about a push to increase fabrication efficiency. In order to increase fabrication efficiency, equipment makers now seek to reduce processing equipment footprint, cost of ownership, and power consumption, while increasing cluster tool reliability and throughput.

The throughput for a particular cluster tool is mainly dependent on the number of process chambers and the time required for a process chamber to service each wafer. Ideally, the maximum throughput for which a cluster tool is capable is:

$$\text{Maximum ideal cluster tool throughput} = N \cdot \left(\frac{60}{t}\right) \text{ wph}$$

where
N=number of process chambers;
t=time required to process one wafer in minutes; and
wph is the number of wafers per hour that a cluster tool is capable of processing.

In order to calculate the actual throughput, the material handling issues must also be considered. The actual cluster tool throughput will always be less than the ideal throughput because of time lost in wafer transfers through the central chamber. For example, once a process chamber completes a process sequence on a wafer, it may take as much as 30 seconds for the central wafer-handling robot to replace the processed wafer with another unprocessed wafer. Since the time required for the robot to swap wafers detracts from the time in which the process chamber is actually processing wafers, minimizing the wafer swap or handling time at each process chamber will have a direct positive impact on the total throughput of the cluster tool.

A high throughput can be achieved in a number of ways. First, duplicate chambers can be provided. This, however, substantially increases the cost and complexity of each cluster tool. Second, additional wafer handling robots can be provided in each cluster tool. Again, this increases the cost and complexity of each cluster tool. Third, the speed of any individual process can be increased. However, although each process is always being improved upon, each process is typically completed in as short a time as is currently possible. Finally, the handling speed of each wafer by the wafer handling robot can be increased, i.e., the wafer handling robot must rotate and extend as fast as possible without causing the clamped wafer to slip during transport. Slip occurs when the robot accelerates the wafer such that its inertia overcomes the coefficient of static friction between the wafer and the blade material, causing undesired wafer movement and resulting in wafer misalignment and possibly the generation of unwanted particles.

Increasing the handling speed, however, is subject to a number of constraints, such as: each wafer must be securely grasped or clamped by the wafer handling robot in the minimum amount of time; the clamping of the wafer must be firm, but not overly so, so as not to damage the fragile wafer; the clamping and placement of each wafer must be precise and accurate, any misplacement might negatively impact the process and/or damage the wafer; transfer between chambers, or into or out of the cassette, must be smooth so that the wafer does not undergo any unnecessary stress, or in the worst case dislodge from the clamping mechanism; the clamping mechanism must be heat resistant, as some of the processes may expose the clamping mechanism to high temperatures; the clamping mechanism must not introduce into the closed environment any particulates or contaminants that can ultimately damage the wafer or semiconductors (it has been found that particulates as small as the critical dimension or line width of a semiconductor device, currently 0.18 μm, can damage the integrity of an integrated circuit formed on a wafer); the wafer clamping mechanism should be able to automatically center a misplaced wafer; and finally, the wafer clamping mechanism must not apply a static electric field to the wafer, which might discharge and damage the semiconductor devices being fabricated.

Of the abovementioned ways of increasing wafer throughput, increasing the handling speed of each wafer is the most practical and cost effective. Therefore, to address the above criteria, a more robust and better designed wafer clamping mechanism is required.

Currently, in order to minimize the time required to move a silicon wafer from one place to another, many atmospheric wafer-handling robots employ vacuum or electrostatic chucks to hold wafers firmly in place on the robot end-effector during transport. However, since vacuum chucks rely on a pressure differential to create the chucking force to hold the wafer in place, they typically cannot be used in vacuum robot applications. In addition, electrostatic chucks are difficult to incorporate in vacuum robots for a number of reasons including vacuum feed-through design complexities, limited performance, reliability, and cost. As a result, vacuum robots typically rely only on frictional forces between the wafer and robot end-effector to prevent relative motion during transport; and a robot must therefore move slowly enough that the wafer does not move relative to the end-effector. This can significantly impact wafer swap time.

Alternatively, some vacuum robot end-effectors or wafer carrying blades, such as those disclosed in U.S. Pat. No. 5,746,460, are designed with deep wafer carrying pockets or blades that are just slightly larger in diameter than the wafer itself. These tight pockets prevent the wafer from moving on the end-effectors or blades during transport. Also, although the wafer transport robot is required to place wafers with extreme precision, there is no guarantee that the wafer will be precisely placed on the robot end-effector when it is picked up initially. A deep blade or pocket with tapered sides is sometimes used to provide a mechanical centering effect.

Figure 1A:
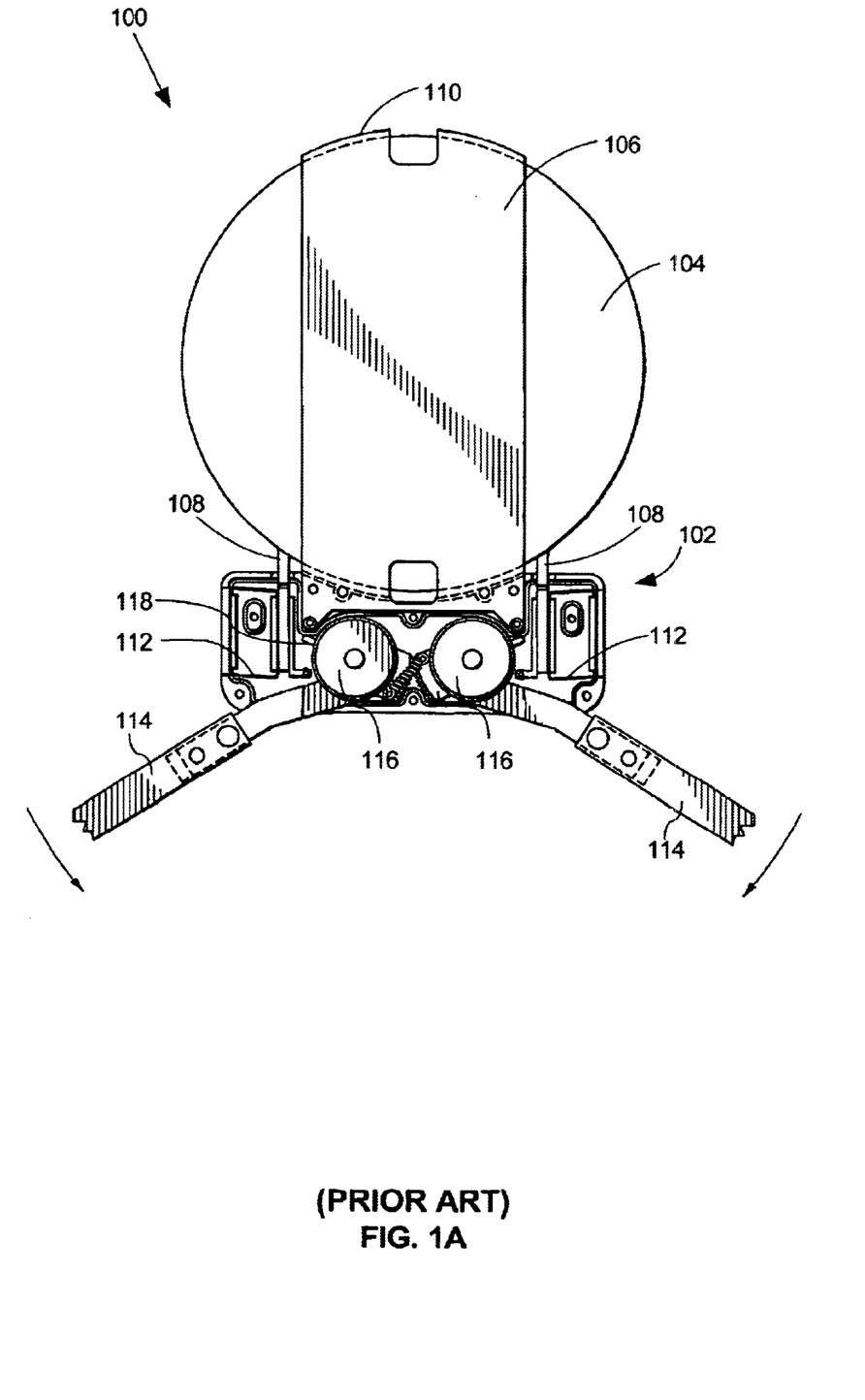
FIG. 1A is a bottom view of a prior art wrist assembly.

A number of prior art devices have attempted to clamp the wafer using active clamping mechanisms. One such prior art device 100 is shown in FIG. 1A which is derived from U.S. Pat. No. 5,955,858. This shows a bottom view of a wrist assembly 102 with its bottom cover plate removed. Clamp fingers 108, shown extended from the wrist assembly 102, engage a perimeter of a wafer 104 to clamp the wafer 104 onto a wafer carrying blade 106. The wafer 104 is held between the fingers 108 and a blade bridge 110 under forces applied by a pair of parallelogram springs 112. Parallelogram springs 112 bias the fingers 108 toward the wafer 104.

The wrist assembly 102 is coupled to the distal end of frog-leg type robot arms 114 of a wafer handling robot. During extension of the robot arms 114, i.e., when the robot arms are drawn toward one another in the direction shown by the arrows in FIG. 1A, a rotation is imparted on pivots 116, which in turn rotate cogs 118. The cogs 118, in turn, engage with the fingers 108 to retract the fingers 108 away from the wafer 104. Therefore, the wafer 104 is released when the robot arms 114 are extended and clamped when the robot arms 114 are retracted. If the fingers were directly attached to the cogs 118, then the clamping force would depend on the motion characteristics of the robot, for example, the speed of extension and retraction of the robot arms 114. In this device the clamping force of the fingers can be set independently by controlling the stiffness of the parallelogram spring 112.

A drawback of wrist assembly 102 is that the parallelogram springs 112 are easily deformed by out-of-plane forces, causing the clamping force direction to deviate from the norm. This leads to unreliable clamping and potential particle contamination caused by friction between the fingers and the wafer. Furthermore, a low cycle life of the parallelogram springs 112 (approximately 1 year or 10 million spring cycles) has been found to be inadequate.

In addition, the wrist assembly 102 does not provide for clamping a wafer that is not centered correctly. If the spring is deformed, the capture pocket, i.e., the total area in which the clamping mechanism can capture a wafer, could easily change, thereby, reducing the tolerance of the wafer handling system to deviations in the position of the wafer during transfer to and from each process chamber.

It has also been found that manufactured parallelogram springs are highly sensitive to manufacturing defects and mishandling before, during, and after installation, leading to unreliable clamping. Furthermore, the manufacturing process for the springs requires an electropolish step, which cannot be controlled reliably. Finally, any kinks in a spring caused by mishandling, lead to stress concentration points that reduce the fatigue life of the spring.

Figure 1B:
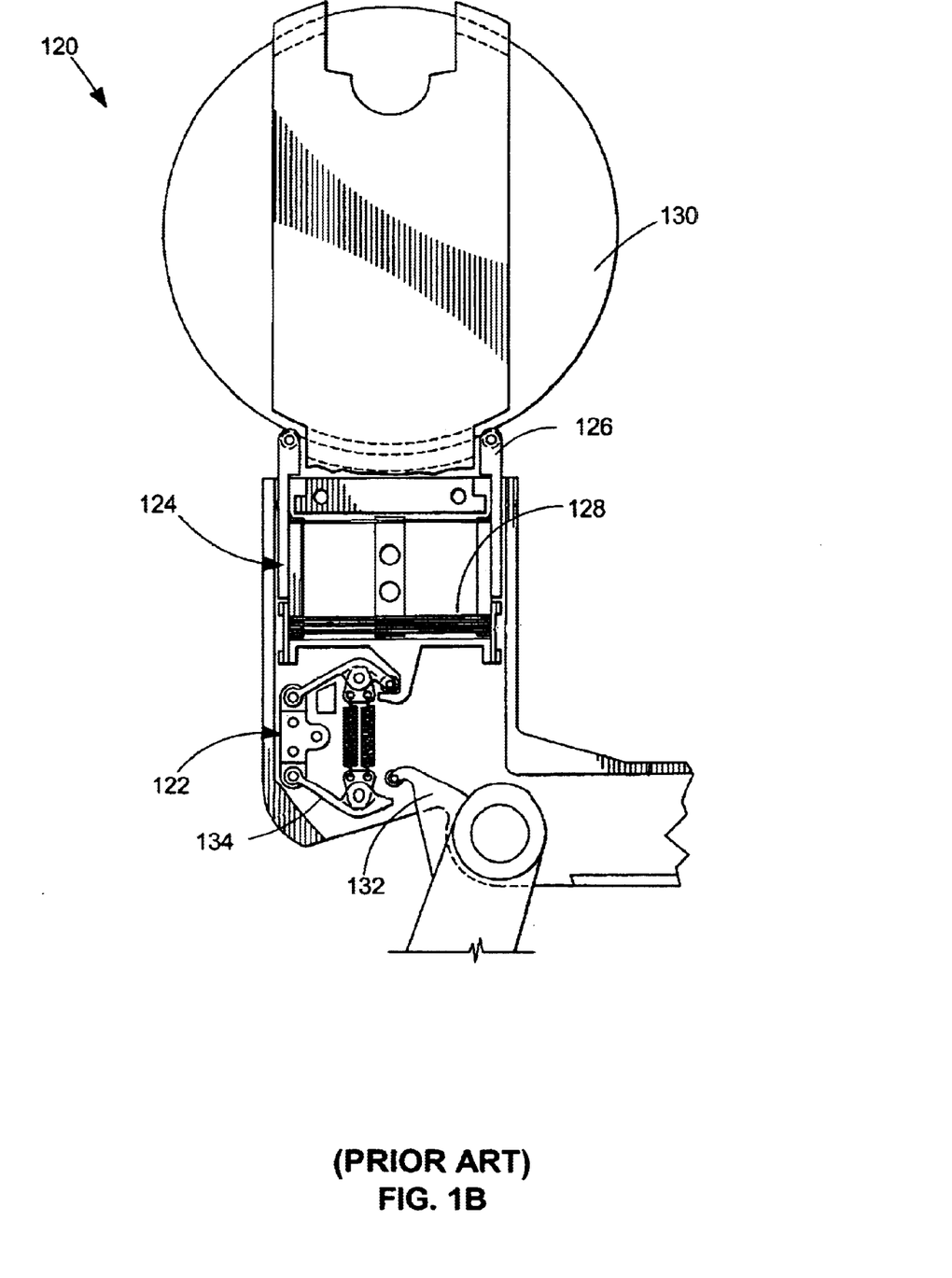
FIG. 1B is a bottom view of another prior art wrist assembly.

Another prior art clamp wrist assembly is disclosed in U.S. Pat. No. 6,155,773. A partial bottom view of this prior art clamp wrist assembly 120 with its bottom cover plate partially removed is shown in FIG. 1B. This clamp wrist assembly 120 comprises a lever assembly 122, a flexure member 124, and a pair of clamp fingers 126 that engage a wafer 130. Leaf springs 128 bias the flexure member 124 against the wafer 130. When the clamp wrist assembly 120 is in its extended position, a translational member 132 engages a first lever 134 to retract the fingers from their clamping position. However, this wrist assembly 120 does not clamp a wafer that is not centered correctly. Moreover, space limitations prevent this clamp wrist assembly 120 from being implemented on an opposed dual blade robot.

Figure 1C:
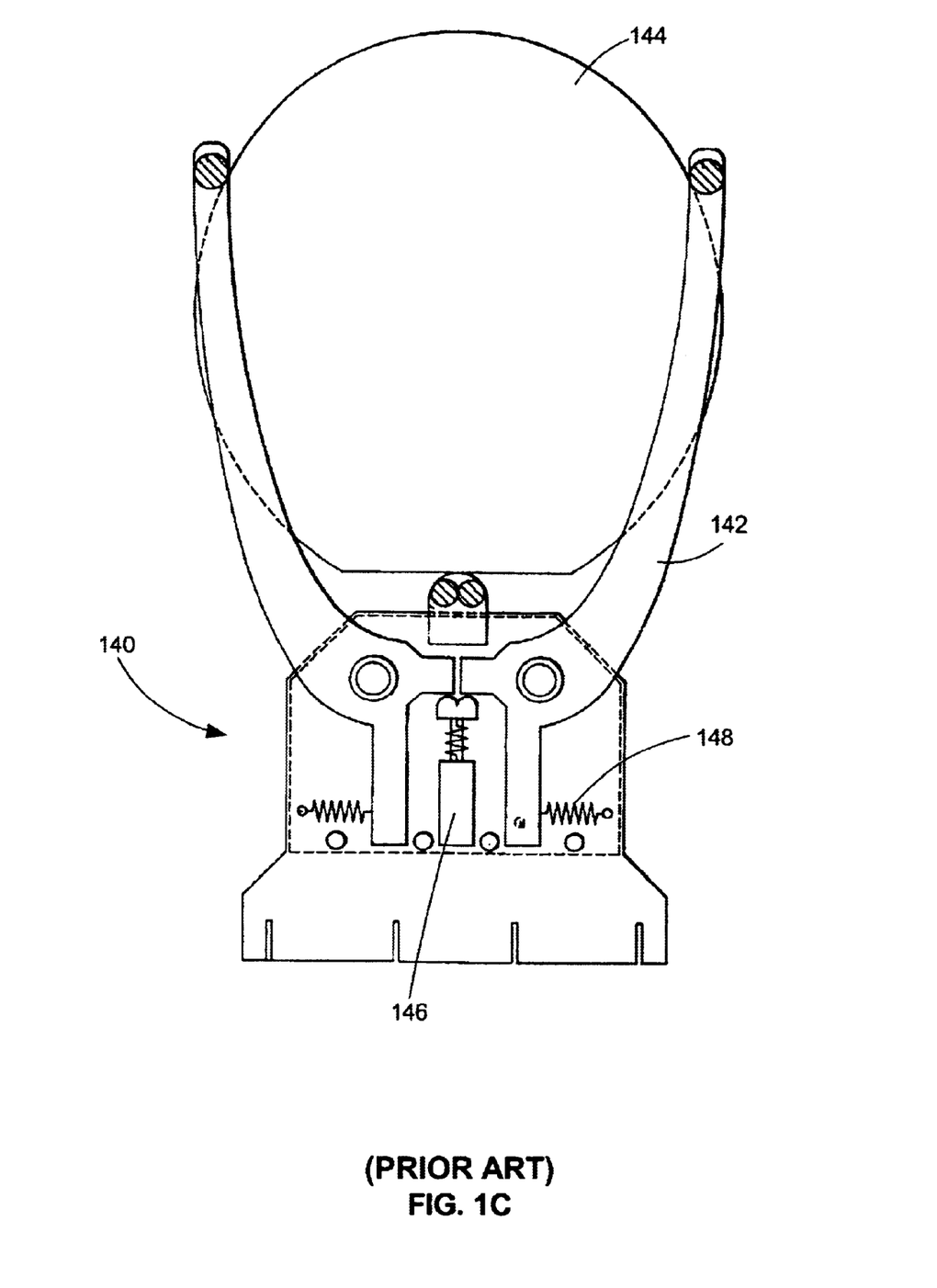
FIG. 1C is a bottom view of yet another prior art wafer holder.

Finally, another prior art wafer holder is disclosed in U.S. Pat. No. 5,810,935. A partial bottom view of this wafer holder 140 with its bottom cover plate removed is shown in FIG. 1C. Wafer holder 140 includes two rotatable holding means 142 for holding rounded edges of wafer 144, and an electrical actuating means 146 for operating the holding means 142. Tension springs 148 bias the holding means 142 towards the wafer 144. Introduction of the electrical actuating means 146 not only introduces additional complexity and cost into the system, but also leads to more potential areas of particle generation and potential electrical fields, both of which might damage the wafer.

In light of the above, there is a need for a wafer clamping mechanism that securely clamps a wafer for speedy handling, meets the abovementioned criteria, and addresses the drawbacks presented by the prior art.

SUMMARY OF THE INVENTION

The present invention is an apparatus for securely holding a silicon wafer on a vacuum robot end-effector or blade by mechanically clamping the wafer during transport. This approach not only allows the robot to move more quickly, but can also mechanically center the wafer during transport.

The wafer clamping apparatus of the present invention includes a cam rotatably coupled to a base plate. The cam is configured to couple with a robot arm. The clamping apparatus also includes a rotating clamp mechanism rotatably coupled to the base plate about a single fixed point. A biasing mechanism, coupled to the rotating clamp mechanism, urges the rotating clamp mechanism to a clamped position. The rotating clamp mechanism is configured to interact with the cam to engage and disengage the rotating clamp mechanism from the clamped position. The rotating clamp mechanism preferably comprises a hub rotatably coupled to the base plate and a clamping arm and cam follower extending from the hub. The clamping arm is configured to clamp a wafer when the rotating clamp mechanism is in the clamped position, while the cam follower is configured to interact with the cam.

The wafer clamping mechanism preferably also includes a wafer carrying blade coupled to the base plate and a robot arm coupled to the cam. In use, the rotating clamp mechanism engages when the robot arm is retracted and disengages when the robot arm is extended.

The clamping mechanism reliably increases throughput while reducing cost. The clamping mechanism also provides the benefit of passive wafer centering, versus more costly active center finding methods, thereby eliminating the potential for failure due to variances in wafer placement. Furthermore, the clamping mechanism can be also be customized such that the wafer contact is made slowly and smoothly, even if the angle between the arm and base plate changes quickly and abruptly.

BRIEF DESCRIPTION OF THE DRAWINGS

For a better understanding of the nature and objects of the invention, reference should be made to the following detailed description, taken in conjunction with the accompanying drawings, in which.

Like reference numerals refer to corresponding parts throughout the several views of the drawings.

DETAILED DESCRIPTION OF THE PREFERRED EMBODIMENTS

Figure 2:
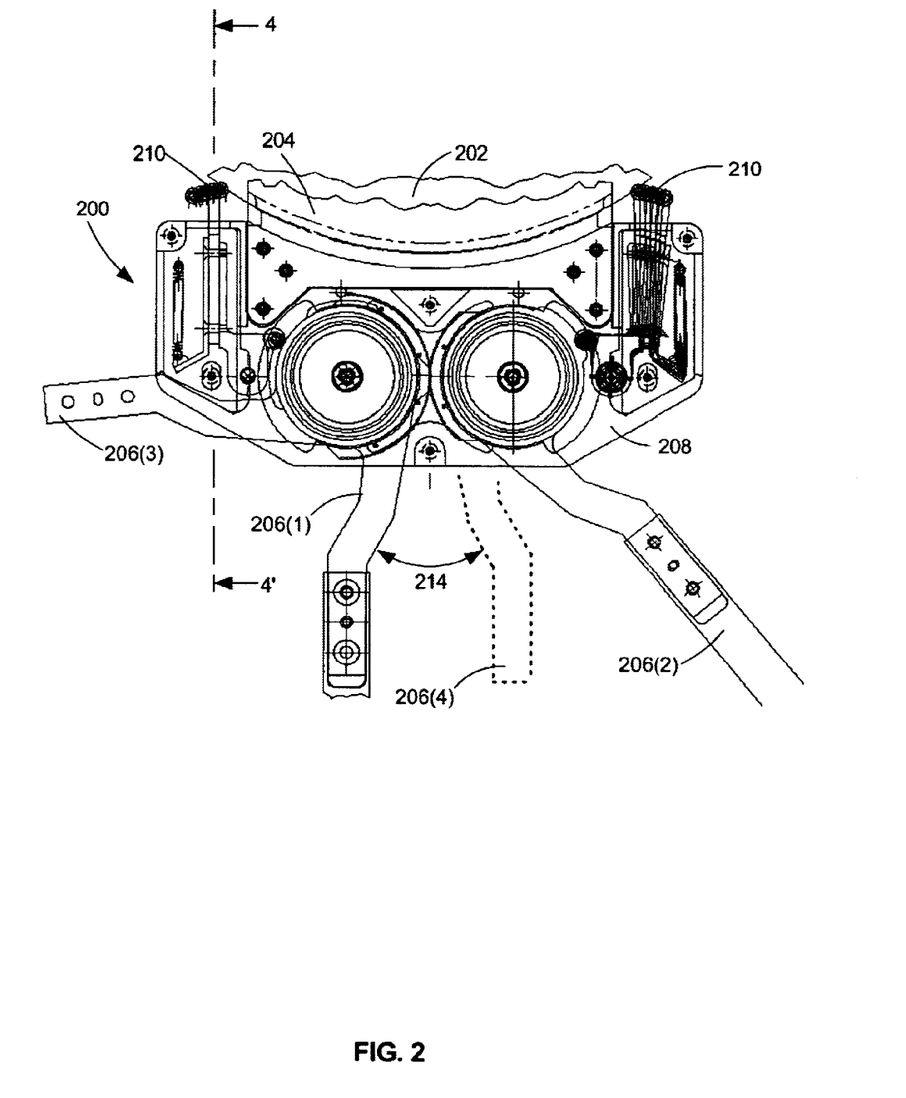
FIG. 2 is a diagrammatic bottom view of a wafer clamping mechanism with its bottom cover plate removed, according to an embodiment of the invention.

FIG. 2 is a diagrammatic bottom view of a wafer clamping mechanism 200 of the present invention with its bottom cover plate removed. Clamping mechanism 200 is shown in various positions, namely clamped, partially unclamped, and unclamped, as explained in further detail below. The clamping mechanism 200 securely clamps a wafer 202, positioned on a wafer carrying blade 204, to the distal end of one or more robot arms 206 of a wafer handling robot (not shown). The robot arms 206 preferably form part of a frog-leg type wafer handling robot similar to that disclosed in U.S. Pat. No. 5,955,858 (incorporated herein).

Normally, a material with a relatively high coefficient of friction is desired for a wafer carrying blade. In fact, polymer material pads are frequently used with a high coefficient of friction to keep the wafer from sliding during transport. However, since the invention requires the wafer to slide relative to the wafer carrying blade 204, a material with a very low coefficient of friction is desirable for the wafer carrying blade 204.

Each robot arm 206 is rotatably coupled to a base plate 208, preferably near the distal end of each robot arm 206. The robot arms 206(1) and 206(2) are shown in FIG. 2. In addition, for each arm a second position 206(3) and 206(4) is illustrated in phantom. The clamping mechanism 200 also includes one or more wafer contact points 210 engage with wafer 202 to clamp the wafer 202 between the wafer contact points 210 and at least one bridge (not shown) located at the distal end of the wafer carrying blade 204. These wafer contact points 210 are shown in various clamped and unclamped positions.

In use, the clamping mechanism 200 is required to release the wafer 202 once the robot arms 206(1)-(2) have been fully extended into either a process chamber, load port chamber, cassette, or the like. The clamping mechanism 200 is preferably actuated as a function of the angle 214 between the robot arms 206(1)-(2). In particular, as the wafer 202 is extended toward a process or load port chamber and the robot arms move toward each other, the clamping mechanism 200 disengages and unclamps the wafer 202. And, as the wafer 202 is withdrawn from a process or load port chamber and the robot arms move away from each other, the clamping mechanism 200 engages and securely clamps the wafer 202.

Robot arm 206(2) is shown in a partially retracted or extended, and thus partially clamped, position of the robot arm.

Robot arm 206(1) is shown in a fully extended, and thus unclamped, position of the robot arm. Phanthom 206(3) depicts fully retracted, and thus clamped, position of robot arm 206(1). Phanthom 206(4) depicts the fully extended, and thus unclamped, position of the robot arm 206(2).

The wafer clamping mechanism is designed such that the clamping force is applied to the wafer at all times other than when the base plate 208 and wafer carrying blade 204 are extended into a chamber or cassette. The engage-to-disengage position is preferably fixed just inside of the shortest chamber reach possible such that the clamping mechanism 200 will release the wafer for all possible process chambers.

Figure 3A:
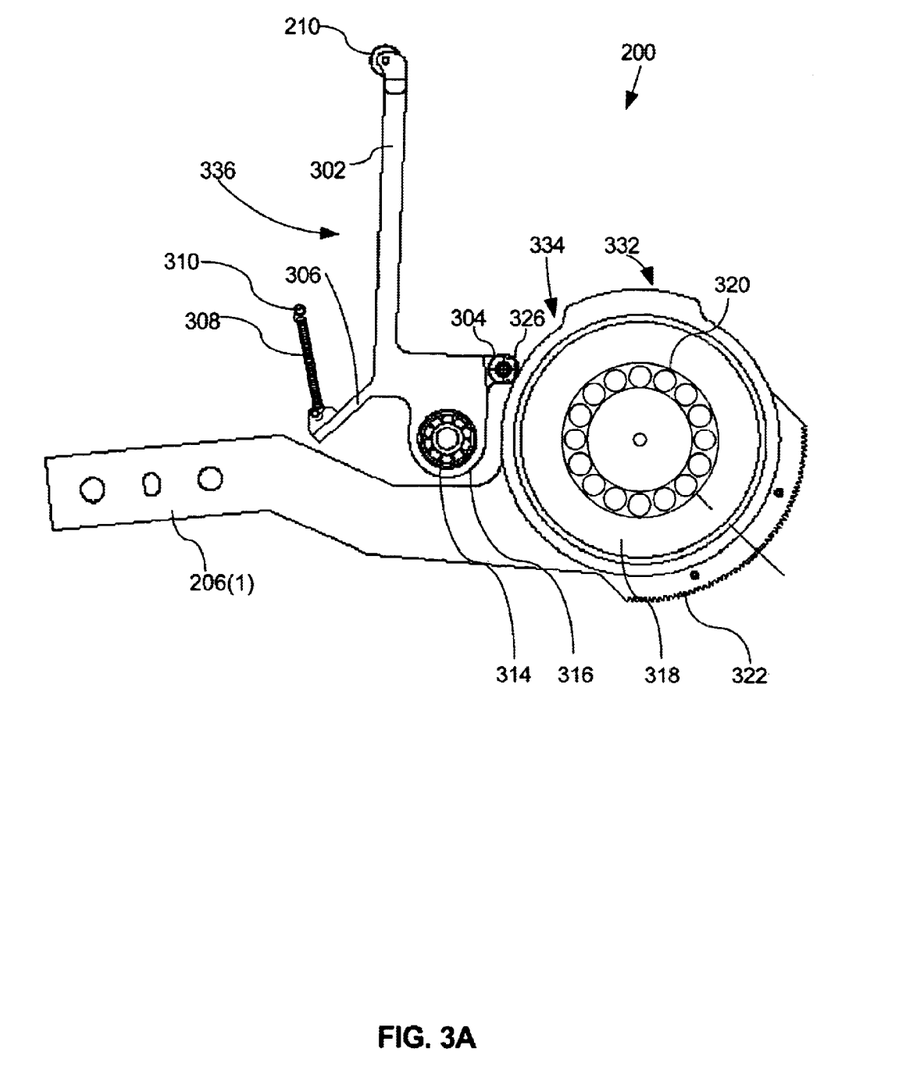
FIG. 3A is a more detailed bottom view of one side of the rotating clamp mechanism shown in FIG. 2, in an engaged or clamped position.

FIG. 3A is a more detailed bottom view of one side of the rotating clamping mechanism 200 shown in FIG. 2, in an engaged or clamped position. The other side of clamp mechanism 200 is a mirror image. A cam 318 is rotatably coupled to the base plate 208 (FIG. 2) by means of a cam bearing 320. The cam 318 is an eccentric or multiply curved wheel mounted on a rotating shaft connected to the base plate 208 (FIG. 2), and is used to produce variable or reciprocating motion of another engaged or contacted part, namely a rotating clamp mechanism 336, described below.

The cam 318 is in turn coupled to a robot arm 206(1), so that the robot arm 206(1) and base plate 208 (FIG. 2) can rotate relative to one another. In a preferred embodiment, the circumference or perimeter of the cam 318 is shaped such that the radius from the rotational center of the cam to the circumference or perimeter of the cam is greater at location 332 than at location 334. Alternatively, the cam 318 can be shaped in any form that achieves the results set out below.

The cam 318 is also preferably coupled to a gear 322 such that opposing gears of the clamping mechanism 200 intermesh to assure an equal and opposite angular rotation of each cam 318, as is best seen in FIG. 2. The intermeshing gears ensure that the blade 214 (FIG. 2) and wafer 202 (FIG. 2) are accurately extended by the robot arms 206, i.e., that the base plate 208 (FIG. 2) is kept substantially perpendicular to the direction of extension and retraction of the robot arms 206. To eliminate play between these two gears 322, caused by a loose intermeshing of the gears, a weak spring (FIG. 2) may be extended between a point on one gear 322 to a point on the other gear 322 such that the spring tension lightly rotates these two gears in opposite directions until light contact between these gears is produced. Alternatively, other mechanisms such as belts, pulleys, or the like, may be used to assure an equal and opposite angular rotation of each cam 318.

The clamping mechanism 200 further comprises a rotating clamp mechanism 336 that engages with the wafer 202 (FIG. 2) to secure the wafer into position. The rotating clamp mechanism 336 preferably comprises a hub 316 rotatably coupled to the base plate 208 (FIG. 2) by means of a hub bearing 314. The rotating clamp mechanism 336 further comprises a clamping arm 302 and a cam follower 304, both of which extend from the hub 316. The primary function of the clamping arm 302 is to engage with the wafer 202, while the primary function of the cam follower 304 is to engage the cam 318, such that rotation of the cam 318 can control the application of a clamping force against the wafer. In a preferred embodiment, the clamping arm 302 and the cam follower 304 are substantially orthogonal to one another.

In a preferred embodiment, the rotating clamp mechanism 336 further includes a biasing arm 306 extending outwards from the hub 316. The biasing arm's primary function is to act as a torque arm to rotate the hub 316, and hence the clamping arm 302, towards the wafer 202. The biasing arm 306 is preferably located diametrically opposite the cam follower 304. A biasing mechanism 308 is preferably coupled on one end to the rotating clamp mechanism 336. In a preferred embodiment the biasing mechanism 308 is coupled between the distal end of the biasing arm 306 and the base plate 208 (FIG. 2). The biasing mechanism 308 creates a force at the distal end of the biasing arm 306, thereby applying a torque to the hub 316 via the biasing arm 306. For example, in the rotational clamp mechanism 336 shown in FIG. 3A the biasing mechanism 308 applies a clockwise torque to the hub 314, thereby urging the clamping arm 302 toward the wafer 202 (FIG. 2).

The biasing mechanism 308 shown in FIG. 3A is preferably a simple tension or extension spring, which can be customized for different applications by selecting various spring stiffnesses. The spring is available off-the-shelf and typically has a fatigue life of over 10 million cycles if the restoring force at full deformation is under 45% of the spring's UTS (Ultimate Tensile Strength). Alternatively, the biasing mechanism 308 may include any suitable biasing means, such as a compression spring attached under the biasing arm 306, a coil spring, a cantilever spring, or the like.

In a preferred embodiment, the rotating clamp mechanism 336 further comprises a wafer contact point 210 disposed toward the distal end of the clamping arm 302. Because many processes are sensitive to metal contamination, and the wafer contact point 210 can potentially shed particles onto the wafer, the wafer contact point 210 is preferably a roller. This is because a non rotatable wafer contact point 210 may cause the wafer to roll on the wafer contact point rather than slide on it, thereby displacing the wafer 202 (FIG. 2) center from the blade 204 (FIG. 2) center and causing an incomplete clamp.

The roller preferably includes a sleeve, a bearing, and a pin. The bearing in turn preferably comprises multiple balls positioned within races. A suitable bearing for medium temperature (up to 450° C.) processes has a pin and races made from stainless steel, such as stainless steel 440C, while the bearing is made from either stainless steel or a ceramic, such as silicon nitride (Si3N4), run with minimal lubricant. Alternatively, the entire bearing and sleeve combination can be ceramic, which is significantly more resistant to corrosive chemicals. These bearings are preferably run dry, i.e., without lubricant, because outgassing of the bearing lubricant close to the wafer edge leads to wafer contamination. The sleeve is selected from a passive material so as not to react with process gases and, thereby discharge by-products or particulates onto the wafer. The remainder of the clamping mechanism, except for the gears that are preferably made from stainless steel, is preferably made from aluminum.

In addition, the wafer contact point 210 is preferably removable to allow the rotatable clamp mechanism 336 to use wafer contact points 210 made from different materials. For example, a high temperature process could use a quartz wafer contact point, while a low temperature process could use a wafer contact point made from Delrin or Aluminum. The materials chosen for the wafer contact point are based on their characteristics, such as Coefficient of Thermal Expansion (CTE), corrosion resistance, and machinability constraints. In a preferred embodiment, the sleeve of the wafer contact point is preferably ceramic. Alternatively, a hybrid bearing, having a Titanium sleeve could be used, as full ceramic bearings (Si3N4 balls and races) generally cost ten times more than the hybrid bearings. Since the standard ball separators, such as cages, crowns, retainers, etc., are not corrosion resistant and the loads at the bearing axis are small, a full complement shielded radial bearing configuration is preferred.

In a similar manner, the cam follower 304 includes a cam contact point 326. In a preferred embodiment, the cam contact point is also a roller having a bearing. The cam contact point 326, the cam bearing 320, and the hub bearing 314 preferably use suitable off-the-shelf bearings as they are not in close proximity to the wafer.

Figure 3B:
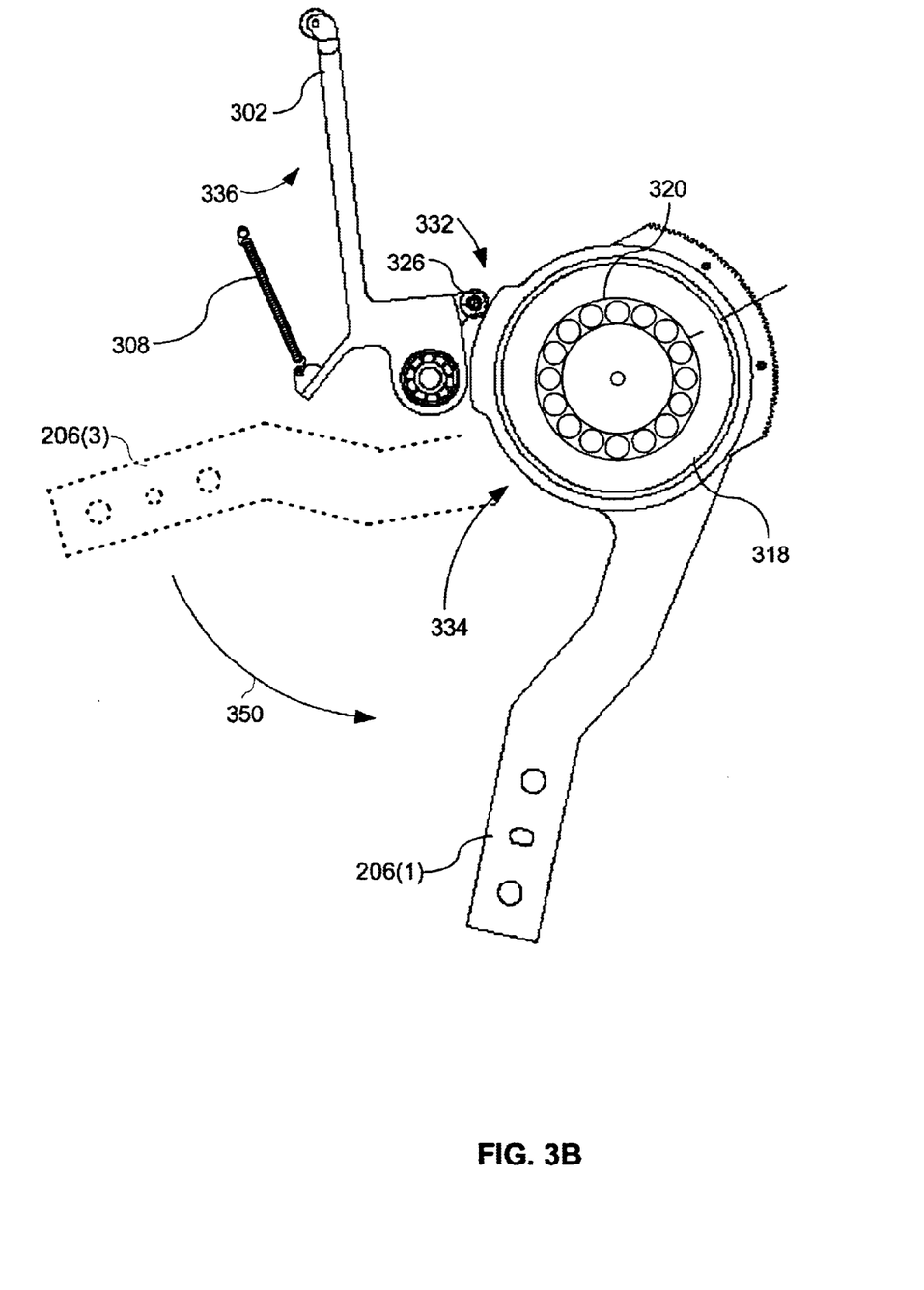
FIG. 3B is a more detailed bottom view of one side of the rotating clamp mechanism shown in FIG. 2, in a disengaged or unclamped position.

FIG. 3B is a more detailed bottom view of one side of the clamp mechanism 200 shown in FIG. 2, in a disengaged or unclamped position. Again, the other side of FIG. 3B is a mirror image. To extend the robot arms 206 toward a chamber, the robot arms 206 are rotated toward each other. Thus, robot arm 206(1) is rotated in the direction shown by arrow 350 from the unextended position 206(3) to the extended position shown in FIG. 3A. In the extended position, the wafer is released, or handed-off, into a chamber. In particular, rotating the robot arms 206 rotates the cam 318 such that the cam contact point 326 engages with the circumference or perimeter of the cam 318 at the higher location 332. This, in turn, causes the rotating clamp mechanism 336 to rotate away from the wafer 202 (FIG. 2), thereby disengaging the clamping mechanism. Since the corresponding clamp mechanism on the other side of clamping mechanism 200 likewise has rotated away from wafer 202, wafer 202 is now free to be released into a chamber or cassette. It should also be noticed that the torque force applied by the biasing mechanism 308 is now counteracted by an equal or greater force at the interface between the cam contact point 326 and cam 318. In contrast, when the robot arms 206 are retracted, i.e., when the robot arms 206 are rotated away from one another as shown for one side of the clamping mechanism in FIG. 3A, both clamp mechanisms 336 are rotated toward each other so as to clamp wafer 202 (FIG. 2) between them so that the wafer can be transferred to a different chamber or cassette.

The timing of the engagement and disengagement of each rotating clamp mechanism 336 can be adjusted based on the length of the clamping arm 302, the length of the cam follower 304, the size of the hub, the shape of the cam 318, etc. The cam profile can also be custom designed to control the position, velocity, and acceleration of the rotating clamp mechanism throughout its range of motion.

Figure 4:
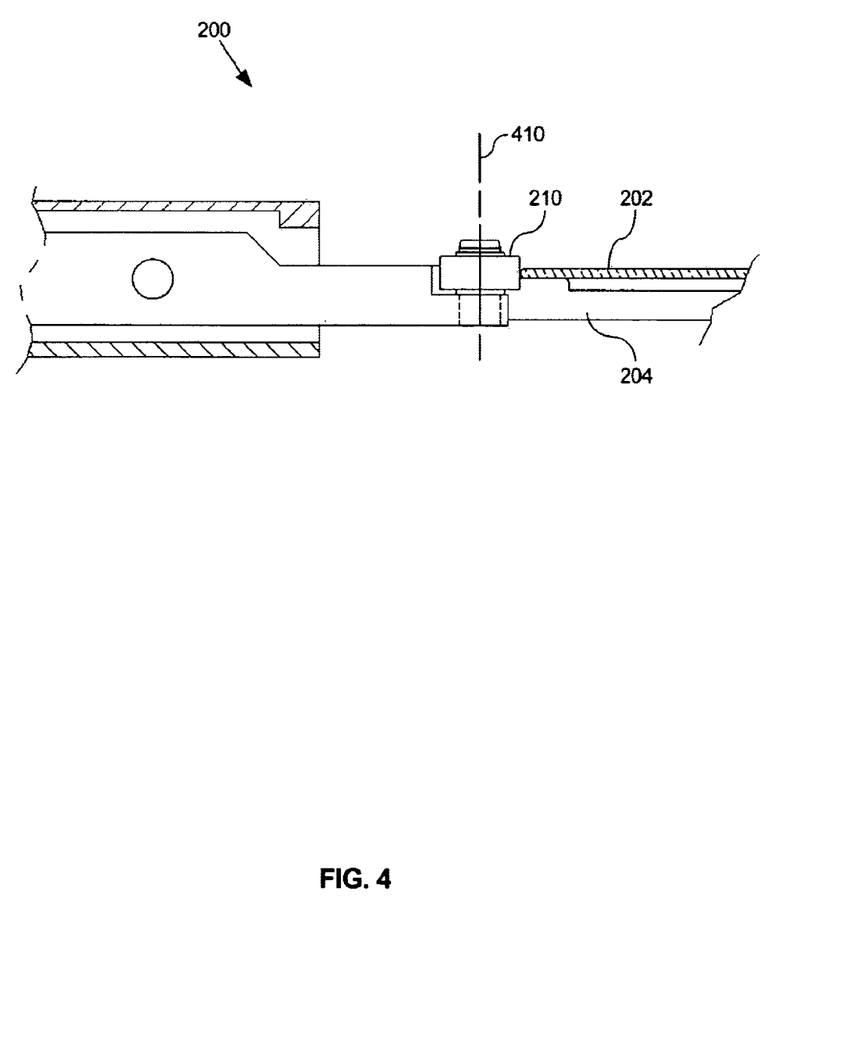
FIG. 4 is a partial cross-sectional view of the wafer clamping mechanism taken along line 4-4' of FIG. 2.

FIG. 4 is a partial cross-sectional view of the wafer clamping mechanism 200 taken along line 4–4' of FIG. 2. As described above, the wafer contact point 210 is preferably rotatably coupled to the distal end of the clamping arm and is, therefore, free to rotate about axis 410 when engaging with the wafer 202 carried on the wafer carrying blade 204.

Figure 5A:
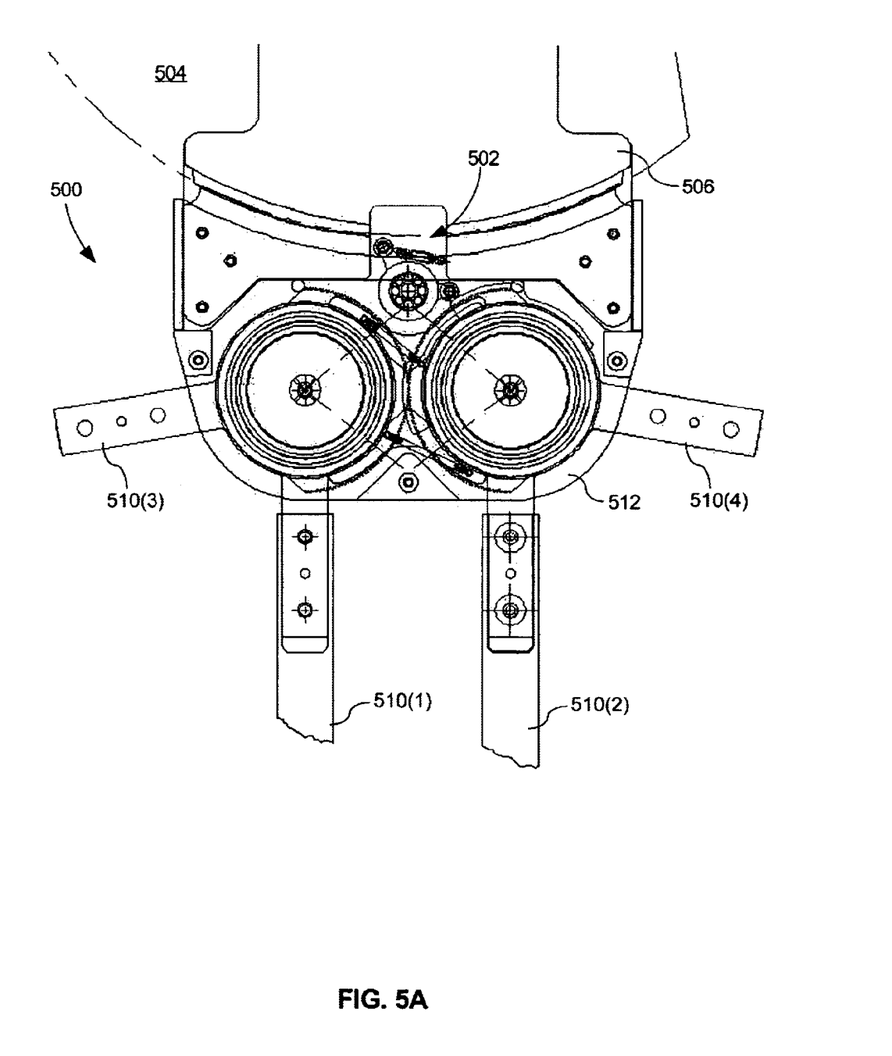
FIG. 5A is a diagrammatic bottom view of a wafer clamping mechanism with its bottom cover plate removed, according to another embodiment of the invention.

FIG. 5A is a diagrammatic bottom view of a wafer clamping mechanism 500 with its bottom cover plate removed, according to another embodiment of the invention. Clamping mechanism 500 is shown in two positions, namely clamped and unclamped. According to the invention, a single rotating clamp mechanism 502 securely clamps a wafer 504, positioned on a wafer carrying blade 506, to the distal end of one or more robot arms 510 (1)–(2) of a wafer handling robot (not shown). The robot arms 510 (1)–(2) preferably form part of a frog-leg type of a wafer handling robot similar to that disclosed in U.S. Pat. No. 5,955,858 (incorporated herein).

Each robot arm 510 (1)–(2) is rotatably coupled to a base plate 512, preferably near the distal end of each robot arm 510 (1)–(2). The rotating clamp mechanism 502 operates in a similar manner to the embodiment described above, where the wafer 504 is unclamped when the robot arms 510(1) and (2) are extended as shown in FIG. 5A and is clamped in position when the robot arms are retracted and in the position indicated by phanthoms 510(3) and 510(4).

Figure 5B:
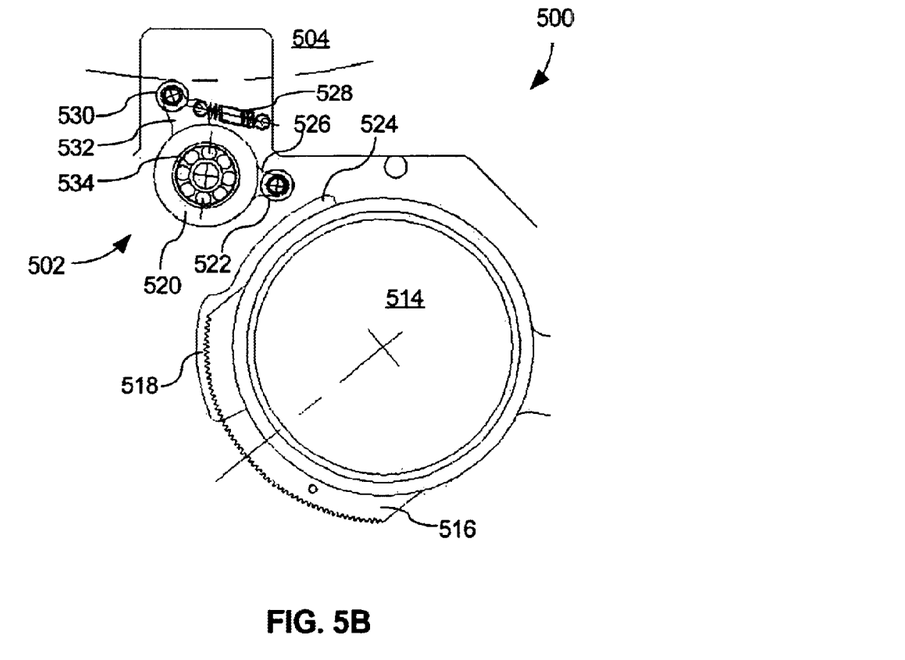
FIG. 5B is a close up view of the clamping mechanism shown in FIG. 5A, in an engaged or clamped position.

FIG. 5B is a close up view of the clamping mechanism 500 shown in FIG. 5A, in an engaged or clamped position. A cam 514 is rotatably coupled to a base plate 512 (FIG. 5A). In a preferred embodiment, the circumference or perimeter of the cam 514 is shaped such that the radius from the rotational center of the cam to the circumference or perimeter of the cam is greater at location 518 than at location 524. Alternatively, the cam 514 can be shaped in any form that achieves the desired results set out below. The cam 518 is also preferably coupled to a gear 516, which serves the same function as gear 322 (FIGS. 3A and 3B).

The rotating clamp mechanism 502 engages with the wafer 504 (FIG. 5A) to secure the wafer in position. The rotating clamp mechanism 502 preferably comprises a hub 520 rotatably coupled to the base plate 512 (FIG. 5A) by means of a hub bearing 534. The rotating clamp mechanism 502 further comprises a clamping arm 532 and a cam follower 526, both of which extend from the hub 520. The primary function of the clamping arm 532 is to engage with the wafer 504, while the primary function of the cam follower 526 is to engage the cam 514, such that rotation of the cam 514 can control the application of a clamping force against the wafer 504.

A biasing mechanism 528 is preferably coupled on one end to the clamping arm 532 to urge the clamping arm 532 against the wafer 504 by applying a torque to the hub 520. For example, in the rotating clamp mechanism 502 shown in FIG. 5B the biasing mechanism 528 applies a clockwise torque to the hub 520, thereby urging the clamping arm 532 toward the wafer 504. The biasing mechanism 528 is preferably a simple tension or extension spring, which can be customized for different applications by selecting various spring stiffnesses. The spring is available off-the-shelf and typically has a fatigue life of over 10 million cycles if the restoring force at full deformation is under 45% of the spring's UTS (Ultimate Tensile Strength). Alternatively, the biasing mechanism 528 may include any suitable biasing means, such as a coil spring, a cantilever spring, or the like.

In a preferred embodiment, the rotating clamp mechanism 502 further comprises a wafer contact point 530 disposed toward the distal end of the clamping arm 532. For the reasons described above, wafer contact point 530 is preferably a roller similar to that described above in relation to FIGS. 3A and B. The remainder of the rotating clamp mechanism 502, except for the gears that are preferably made from stainless steel, is preferably made from aluminum.

In a similar manner, the cam follower 526 includes a cam contact point 522. In a preferred embodiment, the cam contact point 522 is also a roller having a bearing. The cam contact point 522, the cam bearing (not shown), and the hub bearing 534 preferably use suitable off-the-shelf bearings as they are not in close proximity to the wafer.

Figure 5C:
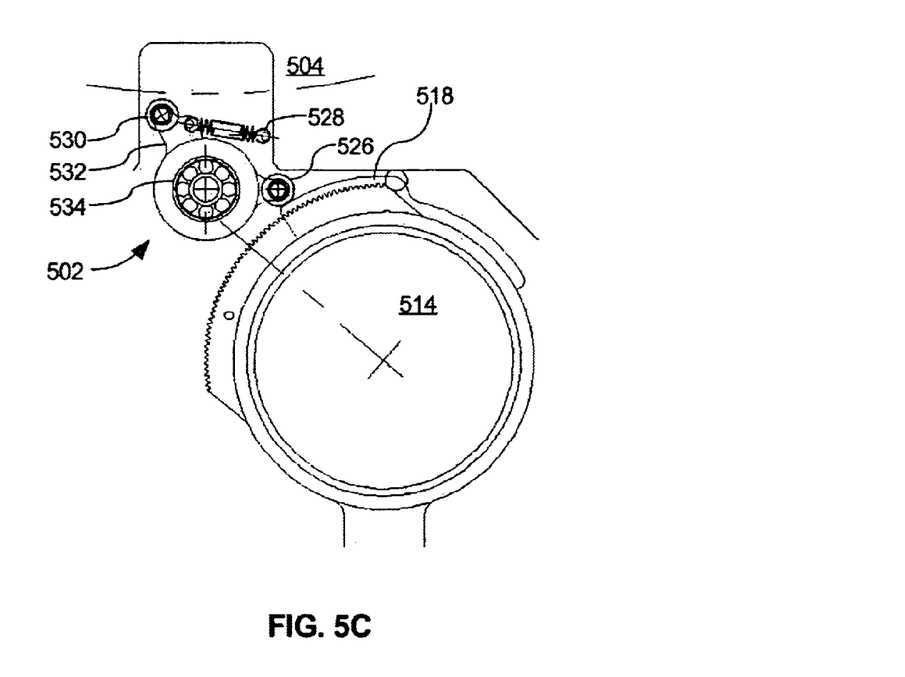
FIG. 5C is a close up view of the clamping mechanism shown in FIG. 5A, in a disengaged or unclamped position.

FIG. 5C is a close up view of the clamping mechanism 500 shown in FIG. 5A, in a disengaged or unclamped position. Rotating the robot arms from the positions 510(3) and 510(4) to the positions 510(1) and 510(2) shown in FIG. 5A rotates the cam 514 such that the cam contact point 522 engages with the circumference or perimeter of the cam 514 at the higher location 518. This in turn causes the rotating clamp mechanism 502 to rotate away from the wafer 504, thereby disengaging clamping arm 532 and unclamping the wafer. It should also be noticed that the torque force applied by the biasing mechanism 528 is now counteracted by an equal or greater force at the interface between the cam contact point 522 and cam 514.

Therefore, when the robot arms are extended, the wafer 504 is released by the rotating clamp mechanism 502 so that the wafer can be released into a chamber or cassette. In contrast, when the robot arms are retracted, i.e., when the robot arms 510(1) and 510(2) are rotated away from one another, the wafer 504 is clamped by the wafer clamping mechanism 500 (FIG. 5A) so that the wafer can be transferred to a different chamber or cassette.

The timing of the engagement and disengagement of the rotating clamp mechanism 502 can be adjusted based on the length of the clamping arm 532, the length of the cam follower 526, the size of the hub 530, the shape of the cam 514, etc. The cam profile can also be custom designed to control the position, velocity, and acceleration of the rotating clamp mechanism throughout its range of motion.

Figure 6:
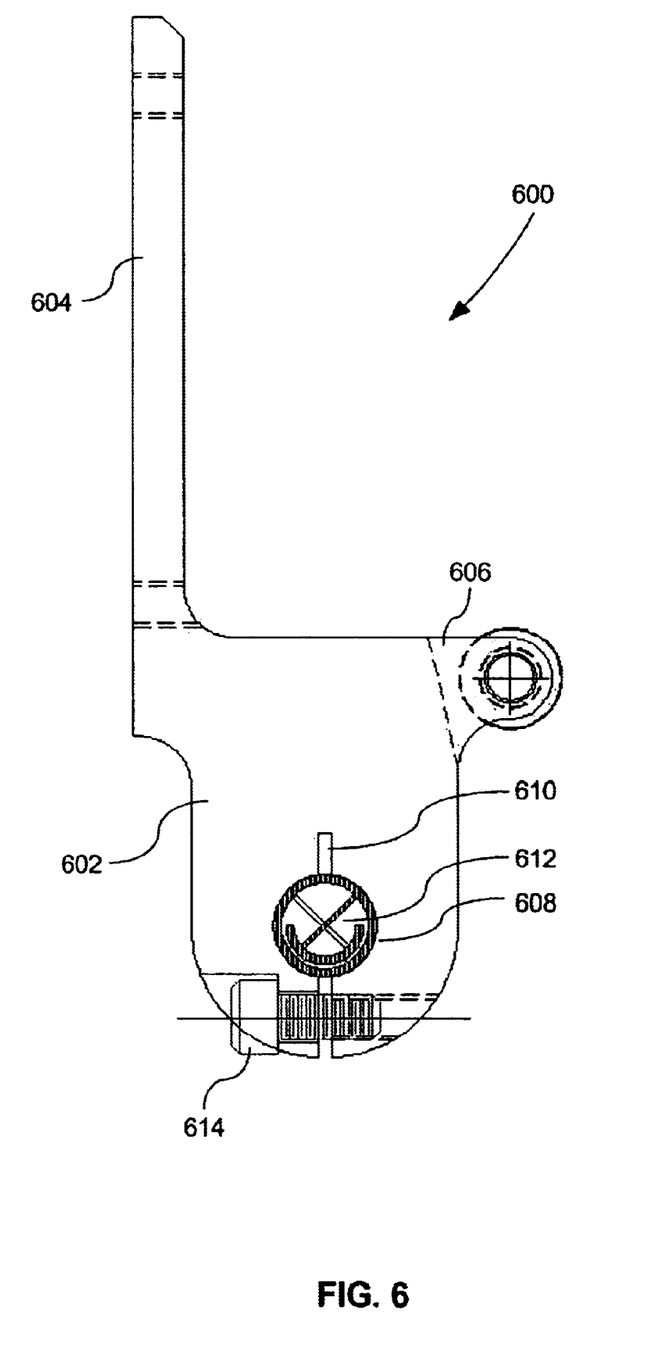
FIG. 6 is a side view of a rotating clamp mechanism according to yet another embodiment of the invention.

FIG. 6 is a side view of a rotating clamp mechanism 600 according to yet another embodiment of the invention. Rotating clamp mechanism 600 can be used in place of rotating clamp mechanism 336 (FIGS. 3A and 3B) or 502 (FIGS. 5A, 5B, and 5C). Rotating clamp mechanism 600 comprises a clamping arm 604 and a cam follower 606 coupled to a rotating hub 602. Rotating clamp mechanism 600 is rotatably coupled to a base plate (not shown) via a C-FLEX mechanism 612 made by C-FLEX Bearing Co., Inc. of Frankfort, N.Y. The C-FLEX mechanism 612 is a frictionless, low hysteresis cylindrical bearing that provides precise single-plane positioning and frictionless motion for limited angular rotation devices (up to +/−30 degrees). This bearing is substantially free of wear and inaccuracies caused by rolling or sliding friction, and does not need lubrication, thereby increasing system efficiency and decreasing downtime.

The C-FLEX is fixed on one end to the base plate, and on the other end to the hub 602. The hub includes a hole 608 therein to receive the C-FLEX 612 and a channel 610 cut through the hole. The hub 602 is slid over the C-FLEX, so that the C-FLEX passes through the hole 608, and a screw 614 is tightened to clamp the hub onto the C-FLEX. In this way, the hub bearings described above in relation to FIGS. 3 and 5 are replaced by the C-FLEX. This has the advantage of reducing any contaminants that may be introduced by the hub bearings. Also, the biasing mechanism of FIGS. 3 and 5 may be eliminated if the torsional stiffness of the C-FLEX is sufficient to bias the clamping arm against the wafer (not shown).

An additional feature of the above described designs is that of mechanical centering. Movement of the wafer from a predetermined release position in a chamber can occur due to sudden dechucking, a surge in backside cooling gas pressure, or wafer lift vibrations while the wafer is still in a process chamber. To address this problem, the effective capture range of the clamping mechanism is set to be larger than the wafer diameter. In other words, if a wafer were to move, but still remain within the effective capture range, the clamping mechanism is still able to capture the wafer in its pocket, recenter, and clamp the wafer. The increased capture area adds robustness of the clamping mechanism in the event there is abnormal wafer movement in a process chamber.

The foregoing descriptions of specific embodiments of the present invention are presented for purposes of illustration and description. They are not intended to be exhaustive or to limit the invention to the precise forms disclosed, obviously many modifications and variations are possible in view of the above teachings. For example, the clamping mechanism may be coupled to other types of robots, not only a frog-leg type robot. Also, these robots may have one or more robot arms. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method is not necessarily intended to occur in the sequence laid out. It is intended that the scope of the invention be defined by the following claims and their equivalents.

What is claimed is:

1. A wafer clamping mechanism, comprising:
   a base plate;
   a first cam rotatably coupled to said base plate about a first cam rotation point, where said first cam is configured to couple with a first robot arm;
   a second cam rotatably coupled with to said base plate about a second cam rotation point different to said first cam rotation point, where said second cam is configured to couple with a second robot arm;
   a first rotating clamp mechanism rotatably coupled to said base plate about a single fixed point, and configured to interact with said first cam to engage and disengage said first rotating clamp mechanism from contacting a wafer; and
   a second rotating clamp mechanism rotatably coupled to said base plate about a single fixed point, and configured to interact with said second cam to engage and disengage said second rotating clamp mechanism from abutting said wafer.

2. The wafer clamping mechanism of claim 1, wherein each of said first and second rotating clamp mechanisms comprise:
   a clamping arm rotatably coupled to said base plate, where said clamping arm is configured to clamp said wafer when said first and second rotating clamp mechanisms are in said clamped position; and
   a cam follower coupled to said clamping arm, where said cam follower is configured to interact with either said first or said second cam.

3. The wafer clamping mechanism of claim 1, wherein each of said first and second rotating clamp mechanisms comprise:
   a hub rotatably coupled to said base plate;
   a clamping arm extending from said hub, where said clamping arm is configured to clamp said wafer when said rotating clamp mechanism is in said clamped position; and
   a cam follower extending from said hub, where said cam follower is configured to interact with one of said first and second cams.

4. The wafer clamping mechanism of claim 3, wherein each of said first and said second rotating clamp mechanisms further comprise:
   a biasing arm extending from said hub; and
   a biasing mechanism coupled between said biasing arm and said base plate.

5. The wafer clamping mechanism of claim 4, wherein said biasing mechanism is a spring.

6. The wafer clamping mechanism of claim 5, wherein said spring is selected from a group consisting of: a tension spring, a compression spring, a coil spring, a cantilever spring, and any combination of the aforementioned.

7. The wafer clamping mechanism of claim 3, wherein said hub includes a hub bearing.

8. The wafer clamping mechanism of claim 7, wherein said hub bearing includes stainless steel races and ball bearings.

9. The wafer clamping mechanism of claim 3, wherein each of said first and said second rotating clamp mechanisms further comprises a wafer contact point disposed toward a distal end of said clamping arm.

10. The wafer clamping mechanism of claim 9, wherein said wafer contact point is a roller.

11. The wafer clamping mechanism of claim 10, wherein said roller includes a bearing that is at least partly ceramic.

12. The wafer clamping mechanism of claim 3, wherein each of said first and said second rotating clamp mechanisms further comprises a cam contact point disposed toward the distal end of said cam follower, where said cam contact point is configured to interact with one of said first and second cams.

13. The wafer clamping mechanism of claim 12, wherein said cam contact point is a roller.

14. The wafer clamping mechanism of claim 1, wherein each of said first and said second cams includes a cam bearing.

15. The wafer clamping mechanism of claim 14, wherein said cam bearing includes stainless steel races and ball bearings.

16. The wafer clamping mechanism of claim 1, further comprising a wafer carrying blade coupled to said base plate, such that in said clamped position said first and said second rotating clamp mechanisms clamps said wafer on said wafer carrying blade.

17. The wafer clamping mechanism of claim 16, wherein said wafer carrying blade includes at least one bridge toward a distal end of said blade, such that in a clamped position said first and said second rotating clamp mechanisms clamps a said wafer on said wafer carrying blade between said first and said second rotating clamp mechanisms and said at least one bridge.

18. The wafer clamping mechanism of claim 1, further comprising:
 a first biasing member configured and dimensioned to bias said first rotating clamp mechanism toward said wafer; and
 a second biasing member configured and dimensioned to bias said second rotating clamp mechanism toward said wafer.

19. The wafer clamping mechanism of claim 1, wherein each of said first and said second rotating clamp mechanisms are rotatably coupled to said base plate by means of a C-FLEX bearing.

20. The wafer clamping mechanism of claim 1, further comprising a robot arm coupled to each of said cams, such that in use each of said first and said second rotating clamp mechanisms engages when said robot arms are retracted, and disengages when said robot arms are extended.

21. The wafer clamping mechanism of claim 1, further comprising:
 a rotary motion transfer mechanism configured and dimensioned to transfer equal and opposite angular rotary motion between said first cam and said second cam.

22. The wafer clamping mechanism of claim 21, wherein said rotary motion transfer mechanism comprises:
 a first gear coupled with said first cam; and
 a second gear coupled with said second cam;
 wherein said first gear and said second gear engage each other.

23. The wafer clamping mechanism of claim 1, further comprising:
 a first gear coupled with said first cam; and
 a second gear coupled with said second cam wherein said first gear and said second gear are configured to translate equal and opposite angular rotary motion between said first cam and said second cam.

24. A wafer clamping mechanism, comprising:
 a base plate;
 a first cam rotatably coupled to said base plate about a first cam rotation point, wherein said first cam is configured to couple with a first robot arm;
 a second cam rotatably coupled to said base plate about a second cam rotation point different from said first cam rotation point, wherein said second cam is configured to couple with a second robot arm;
 a first clamping arm rotatably coupled to said base plate wherein said first clamping arm is configured and dimensioned to interact with said first cam to engage and disengage said first clamping arm from a clamped position about a wafer;
 a second clamping arm rotatably coupled to said base plate wherein said second clamping arm is configured and dimensioned to interact with said second cam to engage and disengage said second clamping arm from said clamped position about said wafer;
 a first biasing member coupled to said first clamping arm, and configured and dimensioned to bias said first clamping arm toward said wafer;
 a second biasing member coupled with said second clamping arm, and configured and dimensioned to bias said second clamping arm toward said wafer;
 a first cam engaging member coupled with said first clamping arm, and configured and dimensioned to engage said first cam; and
 a second cam engaging member coupled with said second clamping arm, and configured and dimensioned to engage said second cam.

25. The wafer clamping mechanism of claim 24, further comprising:
 a first gear coupled with said first cam; and
 a second gear coupled with said second cam wherein said first gear and said second gear are configured and dimensioned to translate equal and opposite angular rotary motion between said first cam and said second cam.

26. A wafer clamping mechanism, comprising:
 a base plate;
 a first cam rotatably coupled to said base plate, wherein said first cam is configured and dimensioned to couple with a first robot arm;
 a second cam rotatably coupled to said base plate, wherein said second cam is configured and dimensioned to couple with a second robot arm;
 a first clamping arm rotatably coupled to said base plate wherein said first clamping arm is configured and dimensioned to interact with said first cam to engage and disengage said first clamping arm from a clamped position about a wafer;
 a second clamping arm rotatably coupled to said base plate wherein said second clamping arm is configured and dimensioned to interact with said second cam to engage and disengage said second clamping arm from said clamped position about said wafer;
 a first gear coupled with said first cam; and
 a second gear coupled with said second cam wherein said first gear and said second gear are configured and dimensioned to translate equal and opposite angular rotary motion between said first cam and said second cam.

27. The wafer clamping mechanism of claim 26, further comprising:
 a first biasing member configured and dimensioned to bias said first clamping arm toward a clamped position; and
 a second biasing member configured and dimensioned to bias said second clamping arm toward a clamped position.

28. The wafer clamping mechanism of claim 26, further comprising:
 a first cam engaging member coupled with said first clamping arm, and configured to engage said first cam; and
 a second cam engaging member coupled with said second clamping arm, and configured to engage said second cam.

29. The wafer clamping mechanism of claim 26, wherein each of said first and said second clamping arms further comprise a wafer contact point disposed toward a distal end of said clamping arms.

* * * * *